(12) United States Patent
Park et al.

(10) Patent No.: US 12,087,853 B2
(45) Date of Patent: Sep. 10, 2024

(54) SEMICONDUCTOR DEVICE, METHOD OF FABRICATING THE SAME, AND DISPLAY DEVICE INCLUDING THE SAME

(71) Applicant: SAMSUNG ELECTRONICS CO., LTD., Suwon-si (KR)

(72) Inventors: Jinjoo Park, Yongin-si (KR); Junhee Choi, Seongnam-si (KR); Kiho Kong, Suwon-si (KR); Joohun Han, Hwaseong-si (KR); Nakhyun Kim, Yongin-si (KR); Junghun Park, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 137 days.

(21) Appl. No.: 17/982,164

(22) Filed: Nov. 7, 2022

(65) Prior Publication Data

US 2023/0062456 A1 Mar. 2, 2023

Related U.S. Application Data

(62) Division of application No. 16/826,926, filed on Mar. 23, 2020, now Pat. No. 11,527,642.

(30) Foreign Application Priority Data

Oct. 8, 2019 (KR) .................. 10-2019-0124776

(51) Int. Cl.
*H01L 27/12* (2006.01)
*H01L 27/15* (2006.01)
(Continued)

(52) U.S. Cl.
CPC ...... *H01L 29/7786* (2013.01); *H01L 27/1214* (2013.01); *H01L 27/156* (2013.01);
(Continued)

(58) Field of Classification Search
CPC ... H01L 29/122–127; H01L 29/15–158; H01L 29/66431; H01L 29/66462;
(Continued)

(56) References Cited

U.S. PATENT DOCUMENTS 6,727,567 B2 * 4/2004 Bastek ............. H01L 21/76264
257/E21.375
7,230,284 B2 * 6/2007 Parikh ................... H01L 29/517
257/E29.253
(Continued)

FOREIGN PATENT DOCUMENTS

JP 10242520 A 9/1998
JP 2000232094 A 8/2000

OTHER PUBLICATIONS

Horikosh, Y., "Migration-enhanced Epitaxy for Low-dimensional Structures", Molecular Beam Epitaxy From Research to Mass Production Book, 2nd Edition, 2018, Elsevier Inc., DOI: B978-0-12-812136-8.00002-5, pp. 27-36.
(Continued)

*Primary Examiner* — Maliheh Malek
(74) *Attorney, Agent, or Firm* — Sughrue Mion, PLLC (57) ABSTRACT

A semiconductor device includes a substrate including a first region and a second region adjacent to the first region, the first and the second regions being disposed in a first direction parallel to an upper surface of the substrate; an etch-stop layer disposed on the first region and the second region; a separation layer disposed on an upper portion of the etch-stop layer, the separation layer being disposed on the first region; a high-electron-mobility transistor (HEMT) element disposed on an upper portion of the separation layer in a second direction perpendicular to an upper surface of the substrate; a light-emitting element disposed on the second region between the substrate and the etch-stop layer; and a plurality of first insulating patterns covering side surfaces of
(Continued)

the HEMT element, the plurality of first insulating patterns extending to the etch-stop layer.

7 Claims, 10 Drawing Sheets

(51) Int. Cl.
  *H01L 29/66* (2006.01)
  *H01L 29/778* (2006.01)
(52) U.S. Cl.
  CPC ...... *H01L 29/66462* (2013.01); *H01L 29/778* (2013.01); *H01L 27/15* (2013.01)
(58) Field of Classification Search
  CPC ......... H01L 29/778–7789; H01L 2924/13064; H01L 27/15–156; H01L 33/0041; H01L 29/7786; H01L 27/1214; H01L 25/0753; H01L 29/2003; H01L 33/22; H01L 21/3065; H01L 21/324; H01L 33/02; H01L 2924/10323; H01L 2924/10344
  See application file for complete search history.

(56) References Cited

U.S. PATENT DOCUMENTS

| | | | | |
|---|---|---|---|---|
| 7,339,209 | B2* | 3/2008 | Brar | H01L 27/0605 257/E29.189 |
| 7,898,047 | B2* | 3/2011 | Sheppard | H01L 21/8258 257/256 |
| 8,076,699 | B2* | 12/2011 | Chen | H01L 27/0605 257/E21.403 |
| 8,796,737 | B2* | 8/2014 | Hwang | H01L 29/205 257/E21.403 |
| 8,946,779 | B2* | 2/2015 | Green | H01L 29/66462 257/256 |
| 9,117,890 | B2* | 8/2015 | Kim | H01L 29/778 |
| 9,245,947 | B2* | 1/2016 | Hwang | H01L 29/0653 |
| 9,269,790 | B2* | 2/2016 | Lee | H01L 29/0843 |
| 9,443,968 | B2* | 9/2016 | Hwang | H01L 29/205 |
| 9,570,600 | B2* | 2/2017 | Lu | H01L 29/7786 |
| 9,614,069 | B1* | 4/2017 | Lu | H01L 29/432 |
| 9,666,677 | B1* | 5/2017 | Raring | H01L 29/402 |
| 9,722,042 | B2* | 8/2017 | Jiang | H01L 29/66212 |
| 11,362,247 | B2* | 6/2022 | Kong | H01L 33/62 |
| 2002/0125497 | A1* | 9/2002 | Fitzgerald | H01L 21/76251 257/190 |
| 2002/0175346 | A1* | 11/2002 | Brar | H01L 29/1075 257/E29.127 |
| 2006/0051681 | A1* | 3/2006 | Taylor | G03F 1/72 430/323 |
| 2006/0186422 | A1* | 8/2006 | Gaska | H01L 21/30621 257/E29.253 |
| 2008/0258242 | A1* | 10/2008 | Mei | H01L 29/0891 438/597 |
| 2009/0057692 | A1* | 3/2009 | Lee | H01L 27/15 257/89 |
| 2009/0072267 | A1* | 3/2009 | Goshonoo | H01L 27/15 257/E33.001 |
| 2009/0146185 | A1* | 6/2009 | Suh | H01L 29/42364 257/E27.061 |
| 2010/0019279 | A1* | 1/2010 | Chen | H01L 27/0605 257/E21.403 |
| 2010/0301347 | A1* | 12/2010 | Chung | H01L 27/085 438/455 |
| 2011/0089467 | A1* | 4/2011 | Chang | H01L 29/66431 257/E21.403 |
| 2011/0220965 | A1* | 9/2011 | Ohki | H01L 21/28264 257/E21.407 |
| 2012/0119184 | A1* | 5/2012 | Hsu | H01L 33/22 257/E21.24 |
| 2012/0141799 | A1* | 6/2012 | Kub | H01L 31/072 977/734 |
| 2012/0280244 | A1* | 11/2012 | Hwang | H01L 29/7787 257/E21.403 |
| 2012/0305992 | A1* | 12/2012 | Marino | H01L 27/092 438/479 |
| 2013/0299841 | A1* | 11/2013 | Ranglack | H01L 25/167 257/E33.025 |
| 2014/0094223 | A1* | 4/2014 | Dasgupta | H01L 23/535 455/566 |
| 2014/0252368 | A1* | 9/2014 | Lee | H01L 29/4175 257/194 |
| 2016/0211427 | A1* | 7/2016 | Jeong | H01L 33/385 |
| 2016/0365475 | A1* | 12/2016 | Taylor | H01L 33/025 |
| 2017/0309676 | A1* | 10/2017 | Odnoblyudov | H01L 27/1203 |
| 2018/0351035 | A1* | 12/2018 | Chung | H01L 33/504 |
| 2019/0333965 | A1* | 10/2019 | Campanella-Pineda | H01L 21/0254 |
| 2020/0075664 | A1* | 3/2020 | Azize | H01L 33/504 |
| 2020/0328296 | A1* | 10/2020 | Hwang | H01L 29/66462 |
| 2020/0373420 | A1* | 11/2020 | Chou | H01L 29/7786 |
| 2021/0091279 | A1* | 3/2021 | Kong | H01L 33/62 |
| 2021/0184010 | A1* | 6/2021 | Chong | H01L 29/42316 |
| 2022/0278262 | A1* | 9/2022 | Kong | H01L 33/382 |

OTHER PUBLICATIONS

Lee, J-M., et al., "Removal of dry etch damage in p-type GaN by wet etching of sacrificial oxide layer", Journal of Vacuum Science & Technology B, vol. 22 (2), No. 479, Mar./Apr. 2004, pp. 478-482 (5 pages).

Murali, K., et al., "Gallium-Nitride-Based Light-Emitting Diodes" 2014 Nobel Prize in Physics, Resonance, Jul. 2015, pp. 605-616.

Nakamura, S., "Background Story of the Invention of Efficient Blue InGaN Light Emitting Diodes", 2014 Nobel Lecture in Physics, 2014, 37 pages.

Nakamura, S., et al., "Thermal Annealing Effects on P-Type Mg-Doped GaN Films", Japanese Journal of Applied Physics, vol. 31, Part 2, No. 2B, Feb. 15, 1992, pp. L139-L142 (5 pages).

Saarinen, K., "Characterization of native point defects in GaN by positron annihilation spectroscopy", III-V Nitride Semiconductors: Defects and Structural Properties, Elsevier Science B.V., 2000, pp. 109-149.

Tzou, A.-J., et al., "Non-thermal alloyed ohmic contact process of GaN-based HEMTs by pulsed laser annealing", Semiconductor Science and Technology, vol. 31, 2016, pp. 1-8 (9 pages).

\* cited by examiner

SEMICONDUCTOR DEVICE, METHOD OF FABRICATING THE SAME, AND DISPLAY DEVICE INCLUDING THE SAME

CROSS-REFERENCE TO RELATED APPLICATION

This application is a Divisional of U.S. application Ser. No. 16/826,926, filed on Mar. 23, 2020, which is based on and claims priority under 35 U.S.C. § 119 to Korean Patent Application No. 10-2019-0124776, filed on Oct. 8, 2019, in the Korean Intellectual Property Office, the disclosures of which are incorporated by reference herein in their entireties.

BACKGROUND

1. Field

The disclosure relates to semiconductor devices, methods of manufacturing the semiconductor devices, and display devices including the same.

2. Description of Related Art

Light-emitting diodes (LEDs) have been used as light sources for backlight units. LEDs emitting light of different wavelengths were grouped to form one pixel, and pixels configured in this way were arranged in a matrix form and used in full-color LED display devices. Furthermore, attention has been focused on technologies for manufacturing a high-resolution display device using micro-LEDs wherein the length of one side of a chip ("chip size") that constitute a single pixel is 100 micrometers or less. However, in order to manufacture a high-resolution display device using micro-LEDs, high-efficiency small LED chips should be manufactured, and a high level of transfer technology is required to arrange the small LED chips in appropriate positions.

SUMMARY

According to an aspect of the disclosure, a semiconductor device includes a substrate including a first region and a second region adjacent to the first region, the first and the second regions being disposed in a first direction parallel to an upper surface of the substrate; an etch-stop layer disposed on the first region and the second region; a separation layer disposed on an upper portion of the etch-stop layer, the separation layer being disposed on the first region; a high-electron-mobility transistor (HEMT) element disposed on an upper portion of the separation layer in a second direction perpendicular to an upper surface of the substrate; a light-emitting element disposed on the second region, between the substrate and the etch-stop layer; and a plurality of first insulating patterns covering side surfaces of the HEMT element, the plurality of first insulating patterns extending to the etch-stop layer.

The etch-stop layer may include at least one of AlGaN and AlN and may be configured to protect the light-emitting element disposed therebelow from a plasma etching process.

The etch-stop layer may include magnesium (Mg) as a P-type dopant.

The light-emitting element may include a lower semiconductor layer disposed on the first region and the second region of the substrate; an active layer disposed on an upper portion of the lower semiconductor layer, the active layer being disposed on the second region; and an upper semiconductor layer disposed on the active layer.

The semiconductor device may further include a plurality of second insulating patterns extending in the second direction and covering side surfaces of the etch-stop layer, the upper semiconductor layer, and the active layer.

The HEMT element may include a source electrode, a gate electrode, and a drain electrode, and the light-emitting element may include an upper electrode connected to the drain electrode, wherein the upper electrode is connected to the light-emitting element through the etch-stop layer.

The semiconductor device may further include an upper spacer layer provided between the separation layer and the substrate; and a lower spacer layer provided between the upper spacer layer and the substrate, wherein the lower semiconductor layer is disposed between the lower spacer layer and the substrate.

In accordance with an aspect of the disclosure, a display device includes a substrate; a plurality of light-emitting elements disposed on the substrate separated from each other with a predetermined interval therebetween; a plurality of separation layers respectively provided between adjacent light-emitting elements from among the plurality of light-emitting elements; a plurality of HEMT elements respectively disposed on the plurality of separation layers in a direction perpendicular to an upper surface of the substrate; a plurality of etch-stop layers respectively disposed under the plurality of separation layers and above the light-emitting elements; a plurality of first insulating patterns respectively provided on side surfaces of the plurality of HEMT elements and side surfaces of the plurality of etch-stop layers; and a plurality of second insulating patterns respectively provided on side surfaces of the plurality of light-emitting elements and side surfaces of the plurality of etch-stop layers.

Each etch-stop layer from among the plurality of etch-stop layers may include at least one of AlGaN and AlN and is configured to protect from a plasma etching process a respective light-emitting element from among the plurality of light-emitting elements disposed therebelow.

Each etch-stop layer from among the plurality of etch-stop layers may include magnesium (Mg) as a P-type dopant.

In accordance with an aspect of the disclosure, a method of manufacturing a semiconductor device includes stacking a lower semiconductor layer, an active layer, an upper semiconductor layer, a separation layer, an etch-stop layer, a channel layer, and a channel supply layer on an upper region of a substrate which includes a first region and a second region adjacent to the first region, the first and the second regions being disposed in a first direction parallel to an upper surface of the substrate; etching a portion of the channel supply layer, a portion of the channel layer, and a portion of the separation layer disposed on the second region, in a second direction perpendicular to the upper surface of the substrate; performing a high-temperature heat treatment process on the etch-stop layer; and forming a plurality of first insulating patterns by implanting a first dopant into side surfaces of another portion of the channel supply layer, another portion of the channel layer, another portion of the separation layer, and a portion of the etch-stop layer, which are disposed on the first region, and forming second insulating patterns by implanting a second dopant into side surfaces of another portion of the etch-stop layer, a portion of the upper semiconductor layer, and a portion of the active layer, which are disposed on the second region.

The etching process may include a selective plasma etching process, and the etch-stop layer may include at least one of AlGaN and AlN and may be configured to protect the light-emitting element disposed therebelow from the selective plasma etching process.

The etch-stop layer may include magnesium Mg as a P-type dopant, and, in the high-temperature heat treatment process, the magnesium Mg may be dispersed into the upper semiconductor layer and hydrogen gas contained in the upper semiconductor layer may be discharged to an outside of the semiconductor device.

The high-temperature heat treatment process may be performed under a nitrogen atmosphere at a temperature of 700° C. or more to 1000° C. or less for 3 minutes or less.

The method may further include depositing a deposition material on the etch-stop layer; and annealing the deposition material at a high temperature, wherein the annealed deposition material includes a metal or a metal compound and forms an upper electrode penetrating through the etch-stop layer and contacting the upper semiconductor layer.

The deposition material may include at least one of titanium Ti, aluminum Al, nickel Ni, and gold Au, and the annealing may be performed at a temperature of 400° C. or more for 3 minutes or less.

A source electrode, a drain electrode, and a gate electrode may be disposed on the channel supply layer, and the upper electrode may be connected to the drain electrode.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. In the drawings, like reference numerals refer to the like elements, and a size of each constituent element may be exaggerated for clarity Embodiments are capable of various modifications and may be embodied in many different forms.

It will be understood that when an element or layer is referred to as being "on" or "above" another element or layer, the element or layer may be directly on another element or layer or there may be one or more intervening elements or layers.

As used herein, the singular forms "a," "an" and "the" are intended to include the plural forms as well, unless the context clearly indicates otherwise. It should be understood that, when a part "comprises" or "includes" an element in the specification, unless otherwise defined, it is not excluding other elements but may further include other elements.

Also, in the specification, the term "units" etc. denotes units that process at least one function or operation, and may be realized by hardware, software, or a combination of hardware and software.

Figure 1:
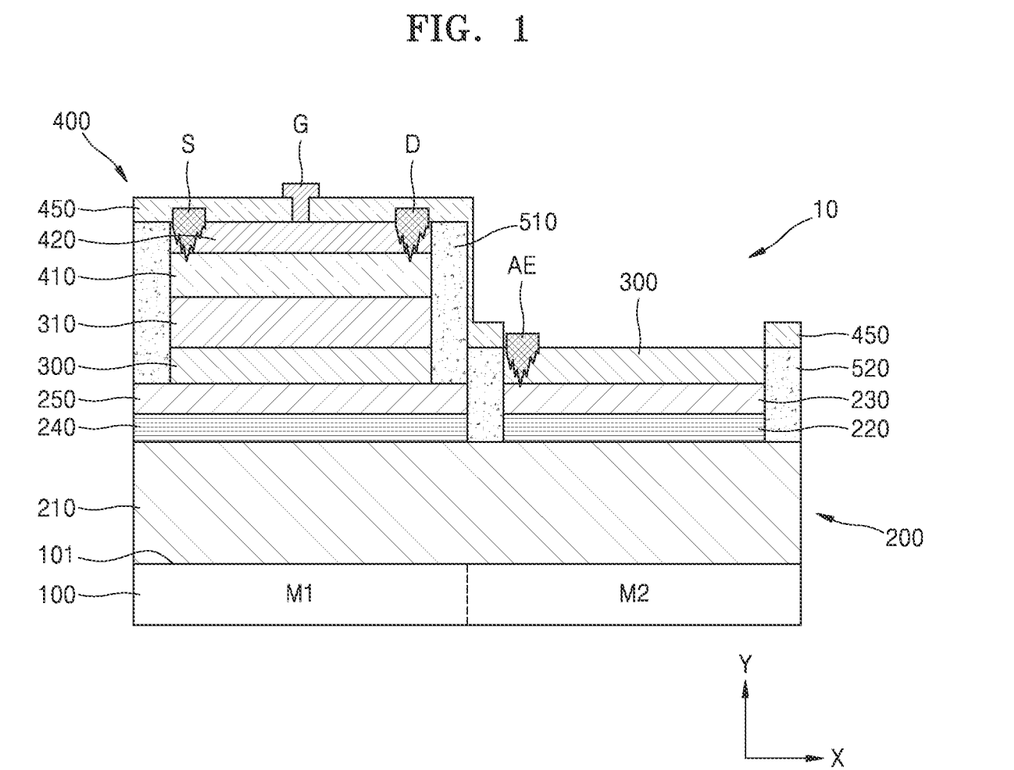
FIG. 1 is a cross-sectional view illustrating a semiconductor device according to an embodiment.

FIG. 1 is a cross-sectional view illustrating a semiconductor device 10 according to an embodiment.

Referring to FIG. 1, the semiconductor device 10 according to an embodiment may include a substrate 100, a light-emitting element 200, a separation layer 310, an etch-stop layer 300, a high electron mobility transistor (HEMT) element 400, first insulating patterns 510, and second insulating patterns 520. The substrate 100 according to an embodiment may include a first region M1 and a second region M2 into which the upper surface 101 of the substrate is divided. In other words, the second region M2 may be adjacent to the first region M1 in a direction parallel to the upper surface 101 of the substrate. As an example, the first region M1 and the second region M2 may be disposed adjacent to a predetermined region in an extending direction of the substrate 100. Also, as an example, the substrate 100 may include a silicon substrate, a glass substrate, a sapphire substrate, or a silicon substrate coated with $SiO_2$.

The light-emitting element 200 may be disposed on the second region M2 of the substrate 100. As an example, the light-emitting element 200 may include a micro LED. For example, the light-emitting element 200 may include a lower semiconductor layer 210, an active layer 220, and an upper semiconductor layer 230.

The lower semiconductor layer 210 may include a Group III-V compound semiconductor having a first conductivity type. For example, the lower semiconductor layer 210 may be disposed over the substrate 100, that is, over both the first region M1 and the second region M2. As an example, the lower semiconductor layer 210 may include n-type GaN.

The active layer 220 may be disposed on a portion of the lower semiconductor layer 210, more specifically, on the second region M2. The active layer 220 may generate light by receiving electrons and holes from the lower semiconductor layer 210 and the upper semiconductor layer 230, which will be described later. The active layer 220 may include a single quantum well (SQW), a multi quantum well (MQW), super lattices (SLs), or a combination thereof. For example, the active layer 220 may include $In_xGa_{1-x}N/GaN$ ($0 \leq x < 1$).

The upper semiconductor layer 230 may be provided on an upper region of the active layer 220, for example, the second region M2. The upper semiconductor layer 230 may include a Group III-V compound semiconductor having a second conductivity type different from the first conductivity type. For example, the upper semiconductor layer 230 may include p-type GaN. The etch-stop layer 300 may be disposed on the upper semiconductor layer 230 to protect the light-emitting region of the light-emitting element 200 from the plasma etching process as described below.

The etch-stop layer 300 may be disposed above an upper surface 101, more specifically, above both the first region M1 and the second region M2 of the substrate 100. The etch-stop layer 300 according to an embodiment may be a protective layer for protecting a light-emitting region of the light-emitting element 200, described above, from a plasma etching process. As an example, the etch-stop layer 300 may include at least one of AlGaN and AlN, and may be doped with a p-type dopant, such as magnesium Mg. At this time, the material AlGaN or AlN included in the etch-stop layer 300 may prevent the generation of an etching process from an etching gas to be described later. Since the etch-stop layer 300 is disposed on the upper semiconductor layer 230, damage to the light-emitting element 200 by a plasma etching process may be prevented, and thus, the problem of degrading a light emission characteristic of the light emitting element 200 may be prevented.

Also, the etch-stop layer 300 may be doped with a p-type dopant, such as magnesium Mg as described above, wherein the p-type dopant may be doped at a ratio of $10^{16} \sim 10^{19}$ cm$^{-3}$. When a high temperature heat treatment, which will be described later, is applied to the etch-stop layer 300 including magnesium Mg as a p-type dopant, magnesium Mg which is a p-type doping material included in the etch-stop layer 300, is additionally supplied to the upper semiconductor layer 230, and thus, the p-type doping material may be additionally supplied to the upper semiconductor layer 230. Accordingly, the p-GaN characteristics of the upper semiconductor layer 230 doped with a p-type dopant may further be enhanced, and thus, the light emission luminance of the light emitting element 200 may be increased.

The separation layer 310 may be disposed on the first region M1 of the substrate 100. The separation layer 310 according to an embodiment may electrically separate the HEMT element 400 disposed above the separation layer 310 from a layer under the separation layer 310. The separation layer 310 may include an insulating material. For example, the separation layer 310 may include undoped GaN or carbon doped GaN.

The HEMT element 400 may be provided on the separation layer 310. The HEMT element 400 may include a channel layer 410, a channel supply layer 420, a gate electrode G, a source electrode S, and a drain electrode D. The channel layer 410 according to an embodiment may include a Group III-V compound semiconductor. For example, the channel layer 410 may include GaN.

The channel supply layer 420 may be a semiconductor layer different from the channel layer 410. As an example, the channel supply layer 420 may have a polarization characteristic, an energy bandgap, and/or a lattice constant different from the channel layer 410. For example, the channel supply layer 420 may have a greater polarization rate and/or energy bandgap than that of the channel layer 410. The channel supply layer 420 may include one or more materials selected from nitrides including at least one of Al, Ga, In, and B. For example, the channel supply layer 420 may include at least one of AlGaN, AlInN, InGaN, AlN, and AlInGaN. The channel supply layer 420 may have a single layer structure or a multi-layer structure.

The gate electrode G, the source electrode S, and the drain electrode D may be disposed on the channel supply layer 420. The gate electrode G, the source electrode S, and the drain electrode D may include one or more of various metals or metal compounds, for example, titanium (Ti), aluminum (Al), nickel (Ni), and gold (Au). The source electrode S and the drain electrode D according to an embodiment may have an ohmic contact with the channel supply layer 420. As an example, the gate electrode G may be disposed on the channel supply layer 420 by using a patterning method. In this case, the source electrode S and the drain electrode D may be disposed to be embedded in the channel supply layer 420 by using a spike method. A method of embedding the source electrode S and the drain electrode D in the channel supply layer 420 by using the spike method will be described in detail with reference to the manufacturing method.

The first insulating patterns 510 may cover side surfaces of the HEMT element 400 and may be disposed to be extended to the etch-stop layer 300. For example, as shown in FIG. 1, the first insulating patterns 510 may extend in a first direction Y from a bottom surface of the etch-stop layer 300 to an upper surface of the channel supply layer 420 via the separation layer 310 and the channel layer 410. The first insulating patterns 510 may be formed by implanting a first dopant into the channel supply layer 420, the channel layer 410, the separation layer 310, and the etch-stop layer 300. For example, the first dopant may include argon Ar.

An upper electrode AE may be disposed on the etch-stop layer 300, and at this point, a portion of the upper electrode AE may be electrically connected to the upper semiconductor layer 230 through the etch-stop layer 300. As an example, the upper electrode AE may be disposed to be embedded in the etch-stop layer 300 by using a spike method. The method of embedding the upper electrode AE in the etch-stop layer 300 by using the spike method will be described in more detail with reference to a manufacturing method. Also, in embodiments, the drain electrode D and the upper electrode AE may be electrically connected. In this case, the HEMT element 400 may be a driving device for operating the light-emitting element 200. The upper electrode AE may include substantially the same material as the gate electrode G, the source electrode S, and the drain electrode D. For example, the upper electrode AE may include one or more of various metals or metal compounds, for example, titanium Ti, aluminum Al, nickel Ni, and gold Au.

The second insulating patterns 520 may be provided on side surfaces of the light-emitting element 200. The second insulating patterns 520 may extend in a first direction (Y direction) from a bottom surface of the active layer 220 to an upper surface of the etch-stop layer 300 via the upper semiconductor layer 230. The second insulating patterns 520 may be provided on the lower semiconductor layer 210. That is, the second insulating patterns 520 may overlap the lower semiconductor layer 210 along the first direction (Y direction), and bottom surfaces of the second insulating patterns 520 may be coplanar with the bottom of the active layer 220. As an example, the second insulating patterns 520 may be formed by implanting a second dopant into the etch-stop layer 300, the upper semiconductor layer 230, and the active layer 220. The second dopant may be substantially the same as the first dopant. For example, the second dopant may include argon Ar.

An upper spacer layer 250 may be provided between the separation layer 310 and the lower semiconductor layer 210. The upper spacer layer 250 may overlap the upper semiconductor layer 230 in a second direction (X direction) perpendicular to the first direction as shown in FIG. 1. The upper spacer layer 250 may have a thickness substantially the same as that of the upper semiconductor layer 230. The upper spacer layer 250 may include substantially the same material as the upper semiconductor layer 230. For example, the upper spacer layer 250 may include p-type GaN.

A lower spacer layer 240 may be provided between the upper spacer layer 250 and the lower semiconductor layer 210. The lower spacer layer 240 may overlap the active layer 220 in the second direction (X direction). The lower spacer layer 240 may have substantially the same thickness as that of the active layer 220. The lower spacer layer 240 may include substantially the same material as the active layer 220. The lower spacer layer 240 may include an SQW, an MQW, SLs, or a combination thereof. For example, the lower spacer layer 240 may include $In_xGa_{1-x}N/GaN$ (0≤x<1).

A passivation layer 450 may be provided on the HEMT element 400, the first insulating patterns 510, and the second insulating patterns 520. The passivation layer 450 according to an embodiment may include an insulating material. For example, passivation layer 450 may include silicon oxide or silicon nitride. The passivation layer 450 may have a single layer structure or a multi-layer structure.

According to an embodiment as described above, the semiconductor device 10 in which the HEMT element 400 and the light-emitting element 200 different from each other are monolithically integrated on one substrate 100 may be provided. Hereinafter, a method of manufacturing the semiconductor device 10 according to an embodiment will be described.

FIGS. 2 through 10 are cross-sectional views for explaining operations of a method of manufacturing the semiconductor device 10 described with reference to FIG. 1.

Figure 2:
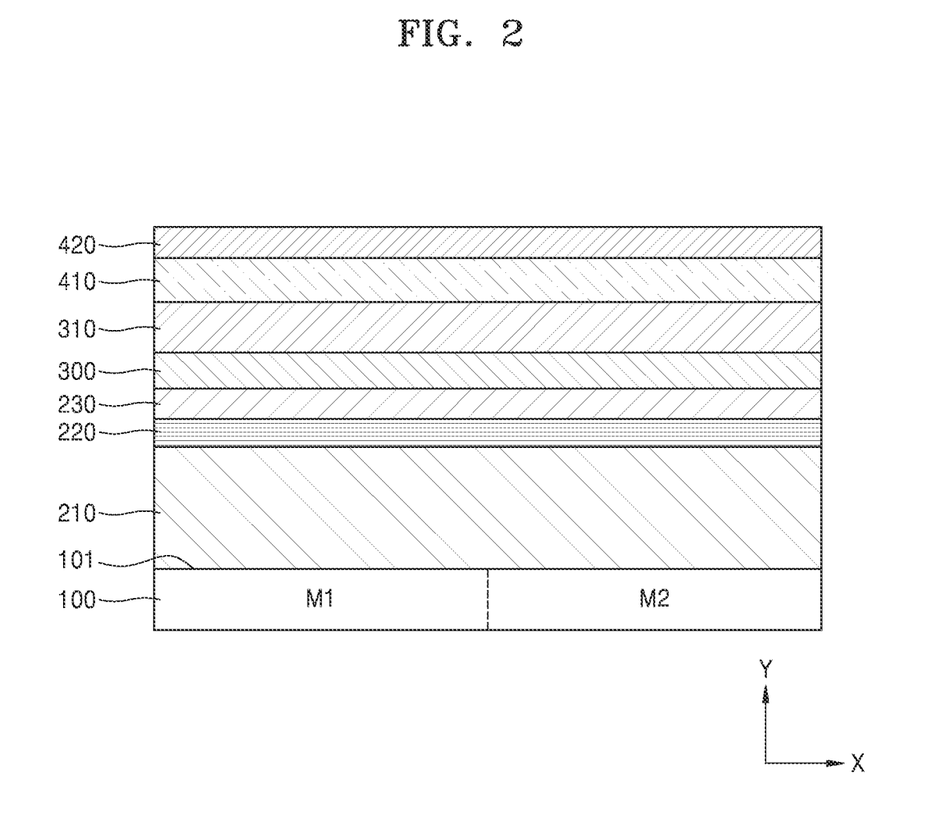
FIG. 2 is a cross-sectional view for explaining a method of manufacturing the semiconductor device described with reference to FIG. 1.

Referring to FIG. 2, a substrate 100 having a flat shape may be prepared. The substrate 100 may include a first region M1 and a second region M2. According to an embodiment, the first region M1 and the second region M2 may be divided into predetermined regions along an upper surface 101 of the substrate 100. For example, the first region M1 and the second region M2 may be distinguished in a second direction (X direction). In other words, the second region M2 may be adjacent to the first region M1 in the second direction.

A lower semiconductor layer 210, an active layer 220, an upper semiconductor layer 230, an etch-stop layer 300, a separation layer 310, a channel layer 410, and a channel supply layer 420 may be sequentially stacked on the substrate 100. For example, the lower semiconductor layer 210, the active layer 220, the upper semiconductor layer 230, the separation layer 310, the etch-stop layer 300, the channel layer 410 and the channel supply layer 420 may be formed by using an epitaxial growth process. The lower semiconductor layer 210, the active layer 220, the upper semiconductor layer 230, the separation layer 310, the etch-stop layer 300, the channel layer 410, and the channel supply layer 420 may overlap both of the first region M1 and the second region M2 in the first direction (Y direction) perpendicular to the upper surface 101 of the substrate 100.

The lower semiconductor layer 210 may include a Group III-V compound semiconductor having a first conductivity type. For example, the lower semiconductor layer 210 may include n-type GaN.

The active layer 220 may include an SQW, an MQW, SLs, or a combination thereof. For example, the active layer 220 may include $In_xGa_{1-x}N/GaN$ (0≤x<1).

The upper semiconductor layer 230 may include a Group III-V compound semiconductor having a second conductivity type different from the first conductivity type. For example, the upper semiconductor layer 230 may include p-type GaN.

The etch-stop layer 300 may be a protective layer for protecting a light-emitting region of the light-emitting element 200 from a plasma etching process. As an example, the etch-stop layer 300 may include at least one of AlGaN and AlN, and may be doped with a p-type dopant, such as magnesium Mg. At this time, the material AlGaN or AlN included in the etch-stop layer 300 may prevent the generation of an etching process from an etching gas to be described later. In this case, the p-type dopant may be doped at a ratio of $10^{16}$~$10^{19}$ cm$^{-3}$. When a high temperature heat treatment, which will be described later, is applied to the etch-stop layer 300 including magnesium Mg as the p-type dopant, magnesium Mg, which is a p-type doping material included in the etch-stop layer 300, is additionally supplied to the upper semiconductor layer 230, and as a result, the p-type doping material may be additionally supplied to the upper semiconductor layer 230. Accordingly, the p-GaN characteristics of the upper semiconductor layer 230 doped with a p-type dopant may further be enhanced, and thus, the light emission luminance of the light emitting element 200 may be increased.

The separation layer 310 may include an insulating material. For example, the separation layer 310 may include undoped GaN or carbon doped GaN.

The channel layer 410 may include a Group III-V compound semiconductor. For example, the channel layer 410 may include GaN.

The channel supply layer 420 may include one or more materials selected from nitrides including at least one of Al, Ga, In, and B. For example, the channel supply layer 420 may include at least one of AlGaN, AlInN, InGaN, AlN, and AlInGaN.

Figure 3:
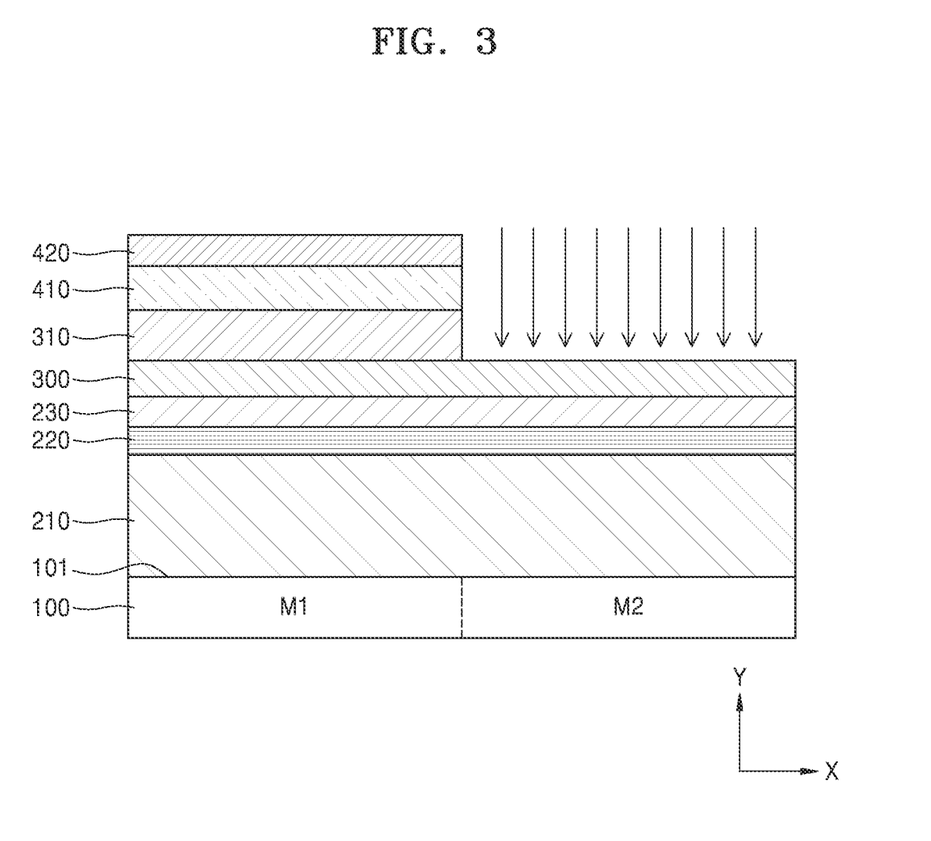
FIG. 3 is a cross-sectional view for explaining a method of manufacturing the semiconductor device described with reference to FIG. 1.

Referring to FIG. 3, the channel supply layer 420, the channel layer 410, and the separation layer 310 according to an embodiment may be patterned. For example, some regions of the channel supply layer 420, the channel layer 410, and the separation layer 310, that is, the channel supply layer 420, the channel layer 410, and the separation layer 310 disposed on the second region M2 may be removed in the first direction (Y direction). For example, a selective etching process may be used for the some regions. In this case, the selective etching process may proceed to the etch-stop layer 300, and thus the channel supply layer 420, the channel layer 410, and the separation layer 310 may be removed. For example, the selective etching process may include a selective inductive coupled plasma etching process. As an example, a gas based on $Cl_2$, $BCl_3$, $CHF_3$, $CF_4$, or $SF_6$ may be used for the selective inductively coupled plasma etching process. At this time, the etch-stop layer 300 may include a material, such as AlGaN or AlN, and thus, the occurrence of an etching process by an etching gas may be prevented. Since the etch-stop layer 300 is disposed on the upper semiconductor layer 230, damage to the light-emitting element 200 by the plasma etching process may be prevented, and thus, the problem of degrading a light emission characteristic of the light emitting element 200 may be prevented.

However, hydrogen gas $H_2$ may penetrate into GaN of the upper semiconductor layer 230 due to the existence of the hydrogen gas H₂ in the plasma etching process or hydrogen gas H₂ supplied from a photoresist mask. In this case, in a p-GaN layer doped with a p-type dopant, such as magnesium Mg, hydrogen gas H₂ penetrated into GaN may combine with magnesium Mg, and thus, magnesium Mg may not function as a dopant. In order to prevent this problem, a separate dehydrogenation process may be required.

Figure 4:
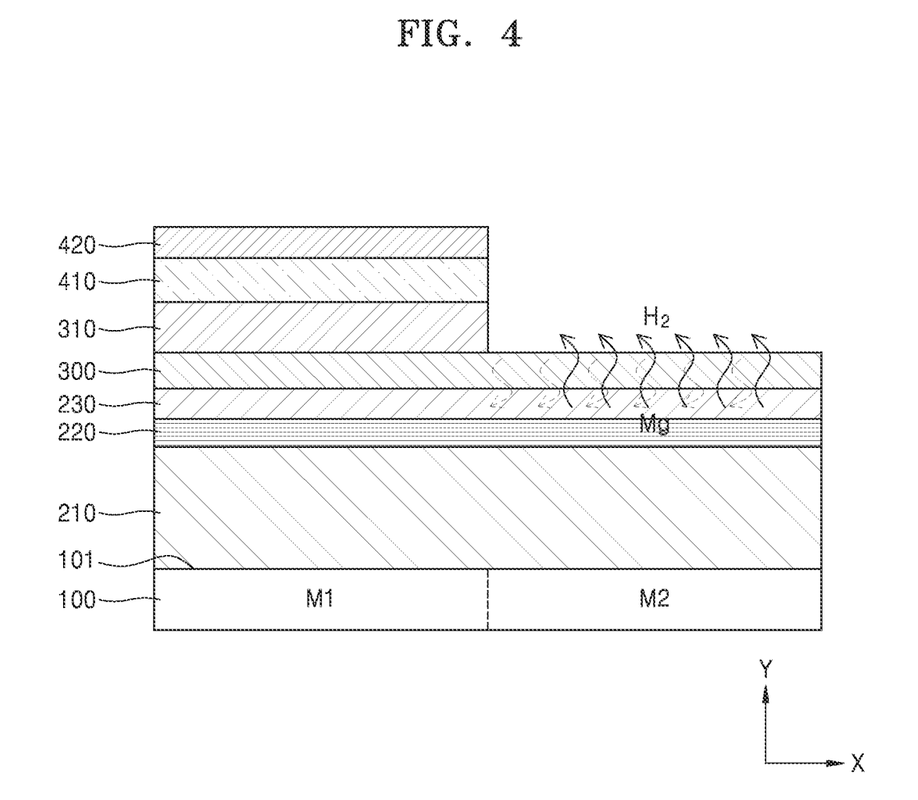
FIG. 4 is a cross-sectional view for explaining a method of manufacturing the semiconductor device described with reference to FIG. 1.

Referring to FIG. 4, according to an embodiment, a heat treatment process may be performed at a predetermined temperature. As an example, a heat treatment process with respect to a plurality of substrate layers shown in FIG. 3 may be performed under a nitrogen N₂ atmosphere at a predetermined high temperature, for example, at a temperature of 700° C. or more to 1000° C. or less for 3 minutes or less. For example, when the heat treatment process described above is performed, hydrogen gas H₂ penetrated into GaN of the upper semiconductor layer 230 may be released from the upper semiconductor layer 230 and removed by combining with nitrogen gas N₂. Accordingly, the p-GaN characteristic of the upper semiconductor layer 230 doped with a p-type dopant may be restored.

Also, when a high temperature heat treatment is applied to the etch-stop layer 300 doped with a high concentration of p-type dopant, such as magnesium Mg which is a p-type doping material included in the etch-stop layer 300, the magnesium Mg is additionally supplied to the upper semiconductor layer 230, and thus, the p-type doping material may be additionally supplied to the upper semiconductor layer 230. Accordingly, the p-GaN characteristics of the upper semiconductor layer 230 doped with a p-type dopant may further be enhanced, and thus, the light emission luminance of the light emitting element 200 may be increased.

Figure 5:
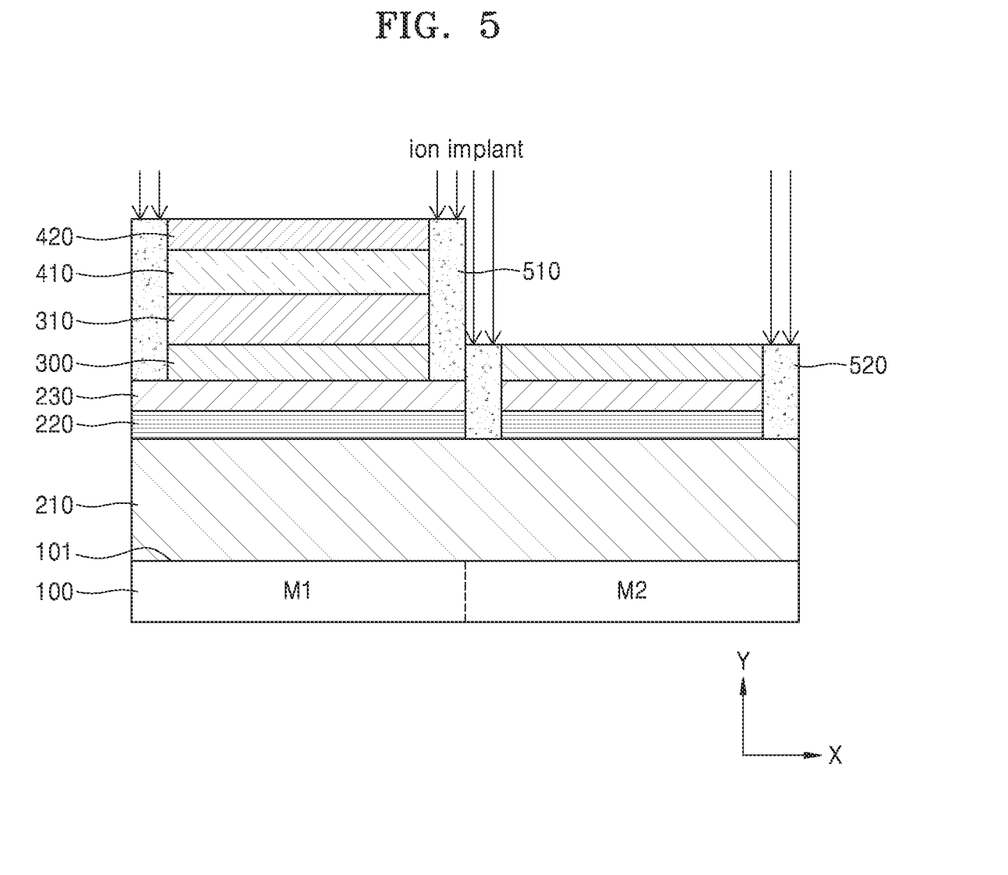
FIG. 5 is a cross-sectional view for explaining a method of manufacturing the semiconductor device described with reference to FIG. 1.

Referring to FIG. 5, the first insulating patterns 510 according to an embodiment may be formed by implanting a first dopant in regions of the channel supply layer 420, the channel layer 410, the separation layer 310, and the etch-stop layer 300 adjacent to boundaries of the first region M1. For example, the process of implanting the first dopant may include an ion implantation process. The process of implanting the first dopant may be performed to a bottom surface of the etch-stop layer 300. That is, the first dopant may be implanted from an upper surface of the channel supply layer 420 to the bottom surface of the etch-stop layer 300. For example, the first dopant may include argon Ar.

The second insulating patterns 520 according to an embodiment may be formed by implanting a second dopant in the etch-stop layer 300, the upper semiconductor layer 230, and the active layer 220 on the second region M2. The second dopant may be implanted in regions of the etch-stop layer 300, the upper semiconductor layer 230, and the active layer 220 adjacent to boundaries of the second region M2. For example, the process of implanting the second dopant may include an ion implantation process. The process of implanting the second dopant may be performed to a bottom surface of the active layer 220. That is, the second dopant may be implanted from an upper surface of the etch-stop layer 300 to the bottom surface of the active layer 220. For example, the first dopant may include argon Ar. In an example, the process of implanting the first dopant and the process of implanting the second dopant may be performed at the same time. The portions of the upper semiconductor layer 230 and the active layer 220 that are positioned on the first region M1 may be referred to as an upper spacer layer 250 and a lower spacer layer 240, respectively.

Figure 6:
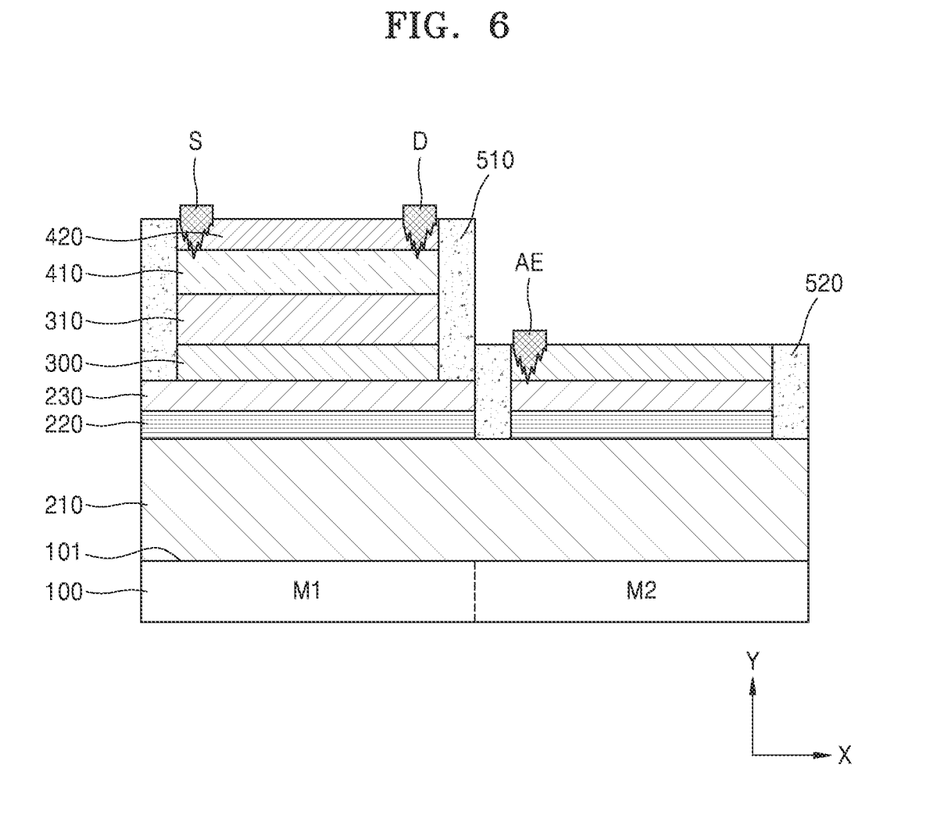
FIG. 6 is a cross-sectional view for explaining a method of manufacturing the semiconductor device described with reference to FIG. 1.

Referring to FIG. 6, according to an embodiment, the source electrode S and the drain electrode D may be formed in an upper region of the channel supply layer 420 and the upper electrode AE may be formed in an upper region of the etch-stop layer 300 by using a spike process. As an example, a deposition material, for example, various metals or metal compounds, for example, one or more of titanium Ti, aluminum Al, nickel Ni, and gold Au may be deposited in a particular region of the upper region of the channel supply layer 420 and an upper region of the etch-stop layer 300 by using a mask. When an annealing process is performed with respect to the material deposited on the channel supply layer 420 and the etch-stop layer 300 for 3 minutes or less at a predetermined temperature, for example, a high temperature of 400° C. or more, the deposition material may be disposed so that a portion of the deposition material is inserted into the channel supply layer 420 and an etch-stop layer 300. In this case, the upper electrode AE may be in contact with the upper semiconductor layer 230 through the etch-stop layer 300. Even when the etch-stop layer 300 is disposed at the top on the upper semiconductor layer 230, the upper electrode AE and the upper semiconductor layer 230 may be electrically connected to each other by using the spike process. Also, the source electrode S, the drain electrode D, and the upper electrode AE may be formed using a single process, and thus, the manufacturing process may be simplified. However, the present disclosure is not limited thereto, that is, the source electrode S and the drain electrode D may be disposed on the channel supply layer 420 by using a separate patterning process.

Figure 7:
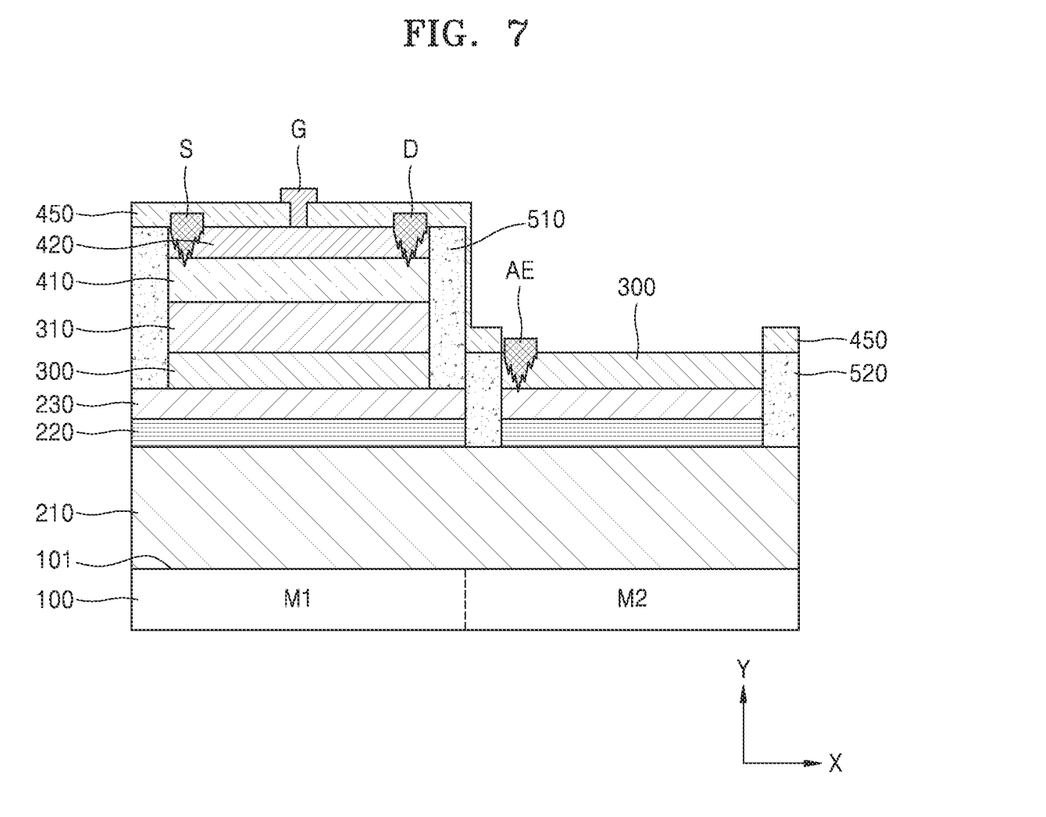
FIG. 7 is a cross-sectional view for explaining a method of manufacturing the semiconductor device described with reference to FIG. 1.

Referring to FIG. 7, the passivation layer 450 may be formed on the channel supply layer 420, the source electrode S, the drain electrode D, the first insulation patterns 510, the upper electrode AE, and the second insulation the patterns 520. For example, the passivation layer 450 may be formed by using a chemical vapor deposition (CVD) process, a physical vapor deposition (PVD) process, or an atomic layer deposition (ALD) process. The passivation layer 450 may extend along surfaces of the channel supply layer 420, the source electrode S, the drain electrode D, the first insulating patterns 510, the upper electrode AE, and the second insulation patterns 520.

The gate electrode G may be formed on the passivation layer 450. A method of manufacturing the gate electrode G according to an embodiment may include, after forming openings that expose the channel supply layer 420 by patterning the passivation layer 450, and after forming a conductive material film including various metals or metal compounds, for example, at least one of titanium Ti, aluminum Al, nickel Ni, and gold Au that fills the openings on passivation layer 450, exposing the passivation layer 450 between the openings by patterning the conductive material film.

The lower semiconductor layer 210, the active layer 220, the upper semiconductor layer 230, and the upper electrode AE formed on the second region M2 may constitute the light-emitting element 200 (refer to FIG. 1) according to an embodiment. The channel layer 410, the channel supply layer 420, the gate electrode G, the source electrode S, and the drain electrode D on the first region M1 may constitute the HEMT element 400 (refer to FIG. 1).

An embodiment of the present disclosure may provide a method of manufacturing a semiconductor device in which the light emitting element 200 (refer to FIG. 1) and the HEMT element 400 (refer to FIG. 1) are monolithically formed on one substrate 100.

Figure 8:
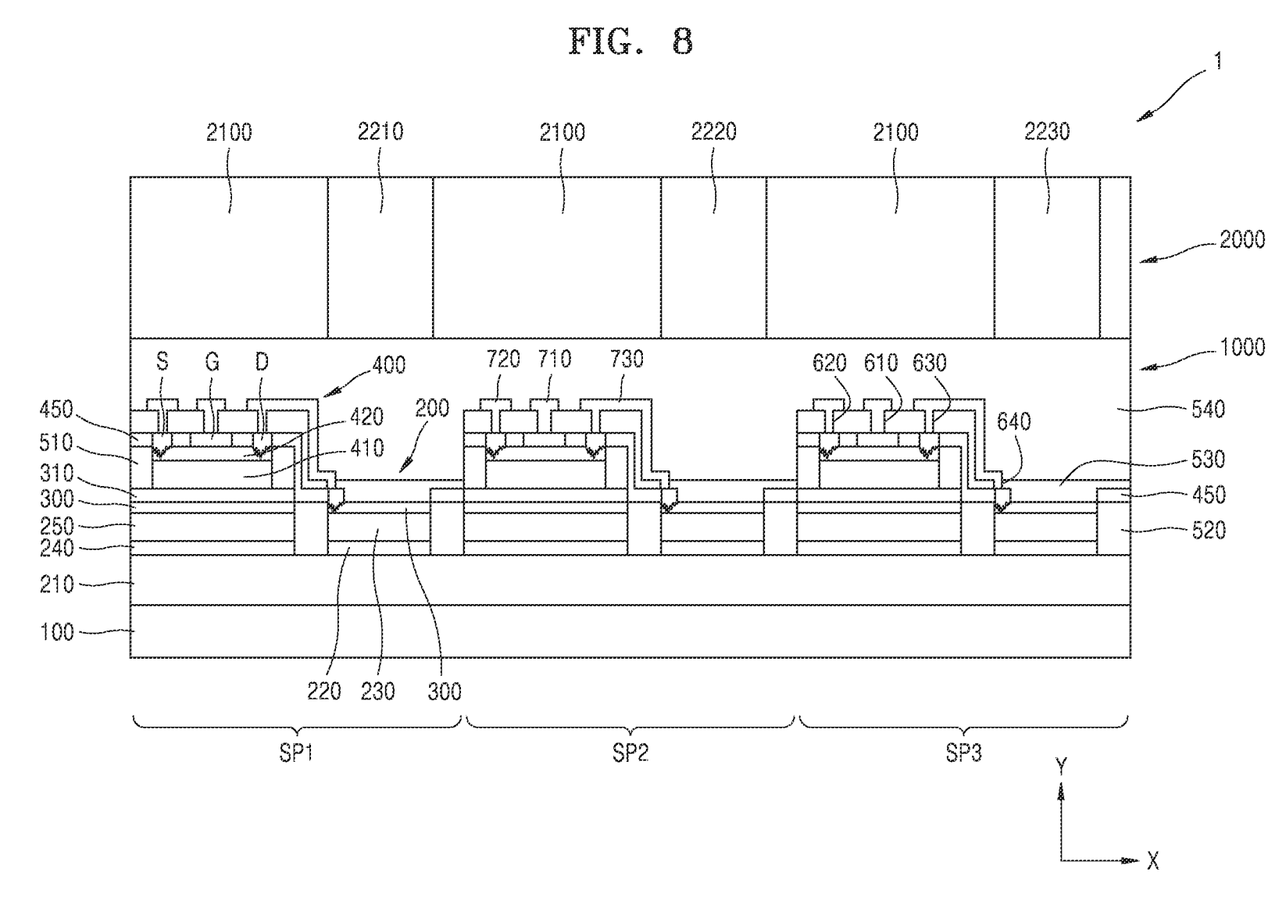
FIG. 8 is a cross-sectional view illustrating a display device according to an embodiment.

FIG. 8 is a cross-sectional view illustrating a display device 1 according to embodiments. For brevity of description, substantially the same descriptions as those given with reference to FIG. 1 may be omitted.

Referring to FIG. 8, the display device 1 including a composite layer 1000 and a light control layer 2000 may be provided. The display device 1 may include a plurality of pixels. However, one pixel is shown for convenience of description. A pixel may include a first sub-pixel SP1, a second sub-pixel SP2, and a third sub-pixel SP3 that respectively emit light having different colors. For example, the first to third sub pixels SP1, SP2, and SP3 may emit red light, green light, and blue light, respectively.

The composite layer 1000 may include a substrate 100, light-emitting elements 200, lower spacer layers 240, upper spacer layers 250, etch-stop layers 300, separation layers 310, and HEMT devices 400, first insulating patterns 510, second insulating patterns 520, lower insulating layers 530, an upper insulating layer 540, and first through fourth contacts 610, 620, 630 and 640, and first through third wirings 710, 720, and 730. The substrate 100, the light elements devices 200, the lower spacer layers 240, the upper spacer layers 250, the etch-stop layers 300, the separation layers 310, the HEMT devices 400, the first insulating patterns 510, and the second insulating patterns 520 may be substantially the same as those described with reference to FIG. 1. However, the substrate 100 and the lower semiconductor layer 210 may extend to cross the first through third sub pixels SP1, SP2, and SP3.

The lower insulating layer 530 may be provided on a passivation layer 450. The lower insulating layer 530 may extend along a surface of the passivation layer 450. The lower insulating layer 530 may cover an upper surface of the etch-stop layer 300 on the light-emitting element 200. For example, the lower insulating layer 530 may directly contact the upper surface of the etch-stop layer 300. For example, the lower insulating layer 530 may include silicon oxide or silicon nitride.

The first contact 610 and the first wiring 710 may be provided on the gate electrode G. The first wiring 710 may be electrically connected to the gate electrode G via the first contact 610. The first wiring 710 may transmit a voltage applying to the gate electrode G. For example, when the HEMT element 400 is a driving element for operating the light-emitting element 200, the first wiring 710 may be electrically connected to a drain electrode of a switching device. The first contact 610 and the first wiring 710 may include a conductive material. For example, the first contact 610 and the first wiring 710 may include a metal.

The second contact 620 and the second wiring 720 may be provided on the source electrode S. The second wiring 720 may be electrically connected to the source electrode S via the second contact 620. The second wiring 720 may transmit a voltage applying to the source electrode S. For example, when the HEMT element 400 is a driving element for operating the light-emitting element 200, the second wiring 720 may be electrically connected to a power line. The second contact 620 and the second wiring 720 may include a conductive material. For example, the second contact 620 and the second wiring 720 may include a metal.

The third contact 630 and the fourth contact 640 respectively may be provided on the drain electrode D and the upper electrode AE. The third wiring 730 may extend from the third contact 630 onto the fourth contact 640 along an upper surface of the lower insulating layer 530. The drain electrode D may be electrically connected to the third wiring 730 via the third contact 630. The upper electrode AE may be electrically connected to the third wiring 730 via the fourth contact 640. Accordingly, the drain electrode D and the upper electrode AE may be electrically connected to each other. For example, the light-emitting element 200 may emit light when a voltage is applied to the upper electrode AE by the third wiring 730.

The upper insulating layer 540 may be provided on the lower insulating layer 530, the first through fourth contacts 610, 620, 630, and 640, and the first through third wirings 710, 720, and 730. An upper surface of the upper insulating layer 540 may be flat. For example, the upper surface of the upper insulating layer 540 may be a planarized layer formed to be parallel to an upper surface of the substrate 100. For example, the lower insulating layer 540 may include silicon oxide or silicon nitride.

The light control layer 2000 may be provided on the upper insulating layer 540. The light control layer 2000 may include black matrices 2100 and first through third light control patterns 2210, 2220, and 2230 respectively disposed between the black matrices 2100. The first through third light control patterns 2210, 2220, and 2230 respectively may be provided in the first through third subpixels SP1, SP2, and SP3. The first through third light control patterns 2210, 2220, and 2230 respectively may correspond to the light emitting elements 200.

The first light control pattern 2210 may emit red light by receiving light emitted from the light-emitting element 200 in the first sub-pixel SP1. When the light-emitting element 200 emits blue light, the first light control pattern 2210 may include, for example, quantum dots (QDs) or phosphors that emit red light by being excited by the blue light. The quantum dots may have a core-shell structure having a core portion and a shell portion, and may also have a particle structure without a shell. The core-shell structure may have a single-shell or multi-shell. For example, the multi-shell may be a double-shell. In embodiments, the QDs may include at least one of a II-VI compound semiconductor, a III-V compound semiconductor, a IV-VI compound semiconductor, a Group IV-based semiconductor, and a graphene QD. For example, the QDs may include at least one of Cd, Se, Zn, S, and InP, but are not limited thereto. The QDs may have a diameter of a few nm or less. For example, the diameter of the QDs may be about 10 nm or less. The first light control pattern 2210 may further include a photoresist and a light scattering agent.

The second light control pattern 2220 may emit green light by receiving light emitted from the light-emitting element 200 in the second sub-pixel SP2. When the light-emitting element 200 emits blue light, the second light control pattern 2220 may include, for example, QDs or phosphors that emit green light by being excited by the blue light. The second light control pattern 2220 may further include a photoresist and a light scattering agent.

The third light control pattern 2230 emit light of the same color by receiving light emitted from the light-emitting element 200 in the third sub-pixel SP3. When blue light is emitted from the light-emitting element 200, the third light control pattern 2230 may emit blue light by receiving light emitted from the light-emitting element 200. The third light control pattern 2230 may include a photoresist and a light scattering agent.

Each of the black matrices 2100 may be provided over a pair of subpixels immediately adjacent to each other (for example, first and second subpixels SP1 and SP2 and second and third subpixels SP2 and SP3). The black matrices 2100 may correspond to the HEMT elements 400, respectively. The black matrices 2100 may absorb light to prevent crosstalk from occurring between the first through third subpixels SP1, SP2, and SP3.

The present disclosure may provide the display device 1 including a semiconductor device in which the HEMT elements 400 and the light emitting elements 200 different from each other are monolithically integrated on one substrate 100.

Figure 9:
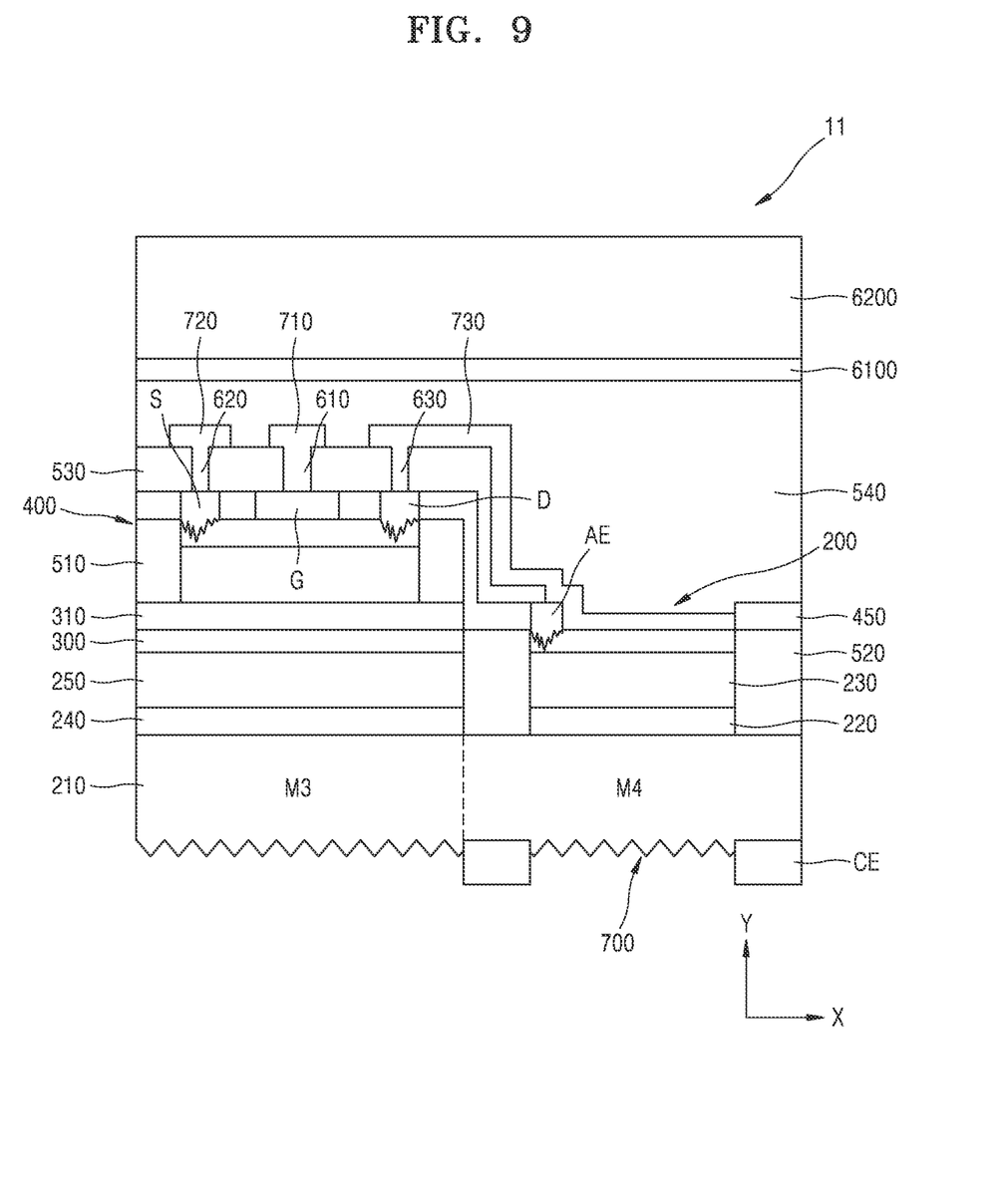
FIG. 9 is a cross-sectional view illustrating a semiconductor device according to an embodiment.

FIG. 9 is a cross-sectional view illustrating a semiconductor device 11 according to an embodiment. For brevity of description, substantially the same descriptions as those given with reference to FIGS. 1 and 8 may be omitted.

Referring to FIG. 9, the semiconductor device 11 according to an embodiment including a light-emitting element 200, an etch-stop layer 300, a separation layer 310, an HEMT element 400, first insulating patterns 510, second insulating patterns 520, a lower insulating layer 530, first through third contacts 610, 620, and 630, first through third wirings 710, 720, and 730, an upper insulating layer 540, a bonding layer 6100, a subsequent substrate 6200, and lower electrodes CE may be provided.

The light-emitting element 200, the etch-stop layer 300, the separation layer 310, the HEMT element 400, the first insulating patterns 510, and the second insulating patterns 520 may be substantially the same as those described with reference to FIG. 1.

The substrate 100 described with reference to FIG. 1 may be removed after the subsequent substrate 6200 is formed. The lower semiconductor layer 210 may include a third region M3 and a fourth region M4. The third region M3 may be provided on the first region M1 (refer to FIG. 1) of the substrate 100 (refer to FIG. 1). The fourth region M4 may be provided on the second region M2 (refer to FIG. 1) of the substrate 100 (refer to FIG. 1).

The lower insulating layer 530, the first through third contacts 610, 620, and 630, the first through third wires 710, 720, and 730, and the upper insulating layer 540 may be substantially the same as those described with reference to FIG. 8. However, the third wiring 730 may extend onto the etch-stop layer 300 beyond the upper electrode AE. The third wiring 730 may cover an upper surface of the etch-stop layer 300. The third wiring 730 may reflect light. For example, the third wiring 730 may reflect a portion of light that is emitted from the active layer 220 and passes through the upper semiconductor layer 230 and the etch-stop layer 300 back towards the lower semiconductor layer 210.

The subsequent substrate 6200 may be provided on the upper insulating layer 540. The subsequent substrate 6200 may be substantially the same as the substrate 100 described with reference to FIG. 1. For example, the subsequent substrate 6200 may include a silicon substrate, a glass substrate, a sapphire substrate, or a silicon substrate coated with $SiO_2$. However, the substrate 100 is not limited thereto.

The bonding layer 6100 may bond the upper insulating layer 540 and the subsequent substrate 6200. For example, the bonding layer 6100 may include a silicon based bonding material. Lower electrodes CE may be provided under the lower semiconductor layer 210, a thickness of which is reduced through etching. The lower electrodes CE may be provided below the fourth region M4. The lower electrodes CE may be electrically connected to the lower semiconductor layer 210. The lower electrodes CE may apply a ground voltage to the lower semiconductor layer 210. The lower electrodes CE respectively may be disposed to overlap the second insulating patterns 520 in the first direction (Y direction) as shown in FIG. 9.

As an example, a bottom surface of the lower semiconductor layer 210 may have a corrugated structure. The corrugate structure may be referred to as light extraction patterns 700. That is, the light extraction patterns 700 may be provided under the lower semiconductor layer 210. The light extraction patterns 700 may be formed by patterning a lower portion of the lower semiconductor layer 210. The light extraction patterns 700 may increase the efficiency of the light emitted from the light-emitting element 200 to be emitted to the outside of the semiconductor device 11. In an example, the light extraction patterns 700 may be a structure different from the lower semiconductor layer 210. In this case, an interface between the light extraction patterns 700 and the lower semiconductor layer 210 may be provided.

When a driving voltage and a ground voltage respectively are applied to the upper electrode AE and the lower electrodes CE, light may be emitted from the active layer 220. Some of the light may be emitted through the bottom surface of the lower semiconductor layer 210 after being reflected by the third wiring 730, and another part of the light is emitted through the bottom surface of the lower semiconductor layer 210 immediately after the light is emitted.

The disclosure may provide a semiconductor device 11 in which the HEMT elements 400 and the light emitting elements 200 different from each other are monolithically integrated on one substrate 100.

Figure 10:
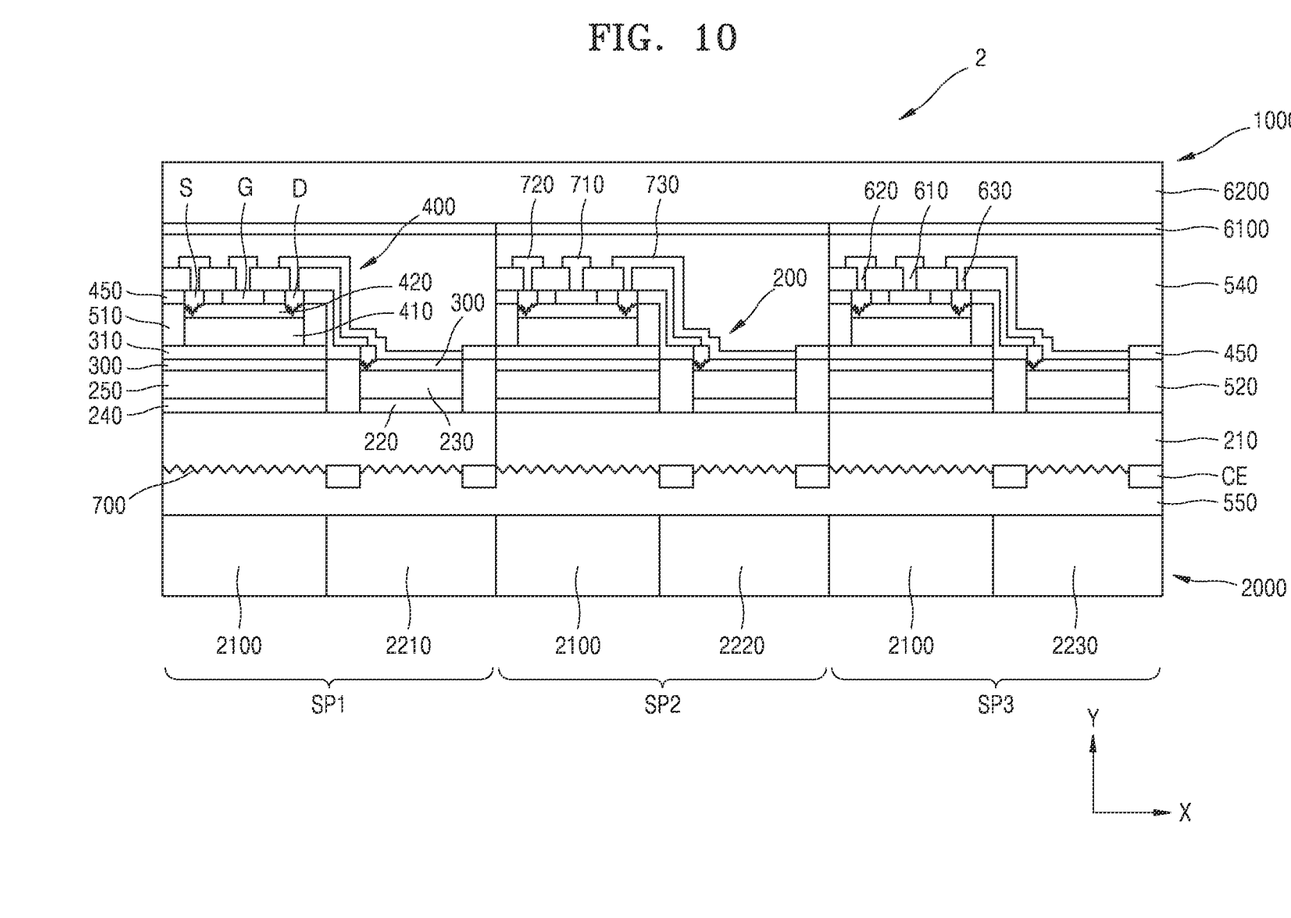
FIG. 10 is a cross-sectional view illustrating a display device according to an embodiment.

FIG. 10 is a cross-sectional view illustrating a display device 2 according to another embodiment. For brevity of description, substantially the same descriptions as those given with reference to FIGS. 8 and 9 may be omitted.

Referring to FIG. 10, the display device 2 including a composite layer 1000 and a light control layer 2000 may be provided.

The composite layer 1000 may include a light-emitting element 200, a separation layer 310, an HEMT element 400, first insulating patterns 510, second insulating patterns 520, first through fourth contacts 610, 620, 630, and 640, first through third wirings 710, 720, and 730, an upper insulating layer 540, a bonding layer 6100, a subsequent substrate 6200, lower electrodes CE, light extraction patterns 700, and an interlayer insulating layer 550. A lower semiconductor layer 210, the bonding layer 6100, and the subsequent substrate 6200 may extend to cross the first through third subpixels SP1, SP2, and SP3. The light-emitting element 200, the separation layer 310, the HEMT element 400, the first insulating patterns 510, the second insulating patterns 520, the lower insulating layer 530, the first through third contacts 610, 620, and 630, first through third wirings 710, 720, and 730, the upper insulating layer 540, the bonding layer 6100, the subsequent substrate 6200, the lower electrodes CE, and the light extraction patterns 700 may be substantially the same as those described with reference to FIG. 9. However, the disclosure is not limited thereto, and in an embodiment, the light extraction patterns 700 may not be provided as illustrated in FIG. 9.

The interlayer insulating layer 550 may be provided under the lower semiconductor layer 210. The interlayer insulating layer 550 may cover a bottom surface of the lower semiconductor layer 210. The lower electrodes CE may be provided between the lower semiconductor layer 210 and the interlayer insulating layer 550. The interlayer insulating layer 550 may have a flat bottom surface. For example, the interlayer insulating layer 550 may include silicon oxide or silicon nitride.

The light control layer 2000 may be provided on the opposite side of the lower semiconductor layer 210 with the interlayer insulating layer 550 therebetween. The light control layer 2000 may cover a bottom surface of the interlayer insulating layer 550. The light control layer 2000 may be substantially the same as described with reference to FIG. 8.

The disclosure may provide a semiconductor device including an HEMT device and a light-emitting element that are monolithically integrated on one substrate.

The disclosure may provide a semiconductor element that may prevent a light-emitting element from being damaged by a plasma etching process and has a high resolution.

The disclosure may provide a method of manufacturing a semiconductor device including an HEMT element and a light-emitting element monolithically integrated on one substrate.

The disclosure may provide a method of manufacturing a semiconductor device that may prevent a light-emitting element from being damaged by a plasma etching process.

However, the advantages are not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a semiconductor device, the method comprising:
   stacking a lower semiconductor layer, an active layer, an upper semiconductor layer, a separation layer, an etch-stop layer, a channel layer, and a channel supply layer on an upper region of a substrate which includes a first region and a second region adjacent to the first region, the first region and the second region being disposed in a first direction parallel to an upper surface of the substrate;
   etching a portion of the channel supply layer, a portion of the channel layer, and a portion of the separation layer disposed on the second region, in a second direction perpendicular to the upper surface of the substrate;
   performing a high-temperature heat treatment process on the etch-stop layer; and
   forming a plurality of first insulating patterns by implanting a first dopant into side surfaces of another portion of the channel supply layer, another portion of the channel layer, another portion of the separation layer, and a portion of the etch-stop layer, which are disposed on the first region, and forming second insulating patterns by implanting a second dopant into side surfaces of another portion of the etch-stop layer, a portion of the upper semiconductor layer, and a portion of the active layer, which are disposed on the second region.

2. The method of claim 1, wherein the etching comprises performing a selective plasma etching process, and
   wherein the etch-stop layer comprises at least one of AlGaN and AlN and is configured to protect the light-emitting element disposed therebelow from the selective plasma etching process.

3. The method of claim 2, wherein the etch-stop layer comprises magnesium Mg as a P-type dopant, and, in the high-temperature heat treatment process, the magnesium Mg is dispersed into the upper semiconductor layer and hydrogen gas contained in the upper semiconductor layer is discharged to an outside of the semiconductor device.

4. The method of claim 3, wherein the high-temperature heat treatment process is performed under a nitrogen atmosphere at a temperature of 700° C. or more to 1000° C. or less for 3 minutes or less.

5. The method of claim 1, further comprising:
   depositing a deposition material on the etch-stop layer; and
   annealing the deposition material at a high temperature,
   wherein the annealed deposition material comprises a metal or a metal compound and forms an upper electrode penetrating through the etch-stop layer and contacting the upper semiconductor layer.

6. The method of claim 5, wherein the deposition material comprises at least one of titanium Ti, aluminum Al, nickel Ni, and gold Au, and
   wherein the annealing is performed at a temperature of 400° C. or more for 3 minutes or less.

7. The method of claim 5, wherein a source electrode, a drain electrode, and a gate electrode are disposed on the channel supply layer, and
   wherein the upper electrode is connected to the drain electrode.

* * * * *